United States Patent
Hong et al.

(10) Patent No.: US 11,817,020 B2
(45) Date of Patent: Nov. 14, 2023

(54) STRETCHABLE DISPLAY AND THE MANUFACTURING METHOD THEREOF

(71) Applicant: Korea University Research and Business Foundation, Sejong Campus, Sejong-si (KR)

(72) Inventors: Mun Pyo Hong, Seongnam-si (KR); Sang Il Kim, Yongin-si (KR); Ho Won Yoon, Seoul (KR); Jeong Sik Yoon, Sejong-si (KR)

(73) Assignee: Korea University Research and Business Foundation, Sejong Campus, Sejong-si (KR)

( * ) Notice: Subject to any disclaimer, the term of this patent is extended or adjusted under 35 U.S.C. 154(b) by 404 days.

(21) Appl. No.: 17/101,583

(22) Filed: Nov. 23, 2020

(65) Prior Publication Data

US 2021/0097902 A1   Apr. 1, 2021

Related U.S. Application Data

(63) Continuation of application No. PCT/KR2019/006052, filed on May 21, 2019.

(30) Foreign Application Priority Data

May 21, 2018   (KR) .................. 10-2018-0057647

(51) Int. Cl.
*G09F 9/30* (2006.01)
*H10K 50/844* (2023.01)
(Continued)

(52) U.S. Cl.
CPC ........... *G09F 9/301* (2013.01); *H10K 50/844* (2023.02); *H10K 71/00* (2023.02); *H10K 77/111* (2023.02)

(58) Field of Classification Search
CPC ...... G09F 9/301; H10K 50/844; H10K 71/00; H10K 77/111; H10K 59/00; H10K 59/12; Y02E 10/549; Y02P 70/50
See application file for complete search history.

(56) References Cited

U.S. PATENT DOCUMENTS 10,176,903 B2 *   1/2019   Sekitani ................. H10K 71/15
2015/0173186 A1 *   6/2015   Na ....................... H05K 1/0283
29/850

(Continued)

FOREIGN PATENT DOCUMENTS

JP   2013-145842 A   7/2013
JP   2016-219543 A   12/2016
(Continued)

OTHER PUBLICATIONS

International Search Report PCT/KR2019/006052 dated, Aug. 28, 2019 (PCT/ISA/210).

*Primary Examiner* — J.E. Schoenholtz
(74) *Attorney, Agent, or Firm* — Sughrue Mion, PLLC

(57) ABSTRACT

A method of manufacturing a stretchable display according to an embodiment of the present invention includes preparing a process carrier substrate, forming a flexible substrate on the process carrier substrate, forming a light emitting layer and a driving element controlling the light emitting layer on the flexible substrate, and attaching a stretchable film divided into a low stretchable area and a high stretchable area such that at least a part of the low stretchable area covers at least a part of the driving element in a state in which the high stretchable area is stretched.

19 Claims, 13 Drawing Sheets

(51) Int. Cl.
*H10K 71/00* (2023.01)
*H10K 77/10* (2023.01)

(56) References Cited

U.S. PATENT DOCUMENTS

2019/0326532 A1* 10/2019 Liu .................. H01L 33/62
2020/0381640 A1* 12/2020 Joo .................. B32B 1/00

FOREIGN PATENT DOCUMENTS

| KR | 10-2015-0020922 A | 2/2015 |
| KR | 10-2015-0069079 A | 6/2015 |
| KR | 10-2015-0108478 A | 9/2015 |
| KR | 10-1551823 B1 | 9/2015 |
| KR | 10-1635914 B1 | 7/2016 |

* cited by examiner

[Fig. 1]
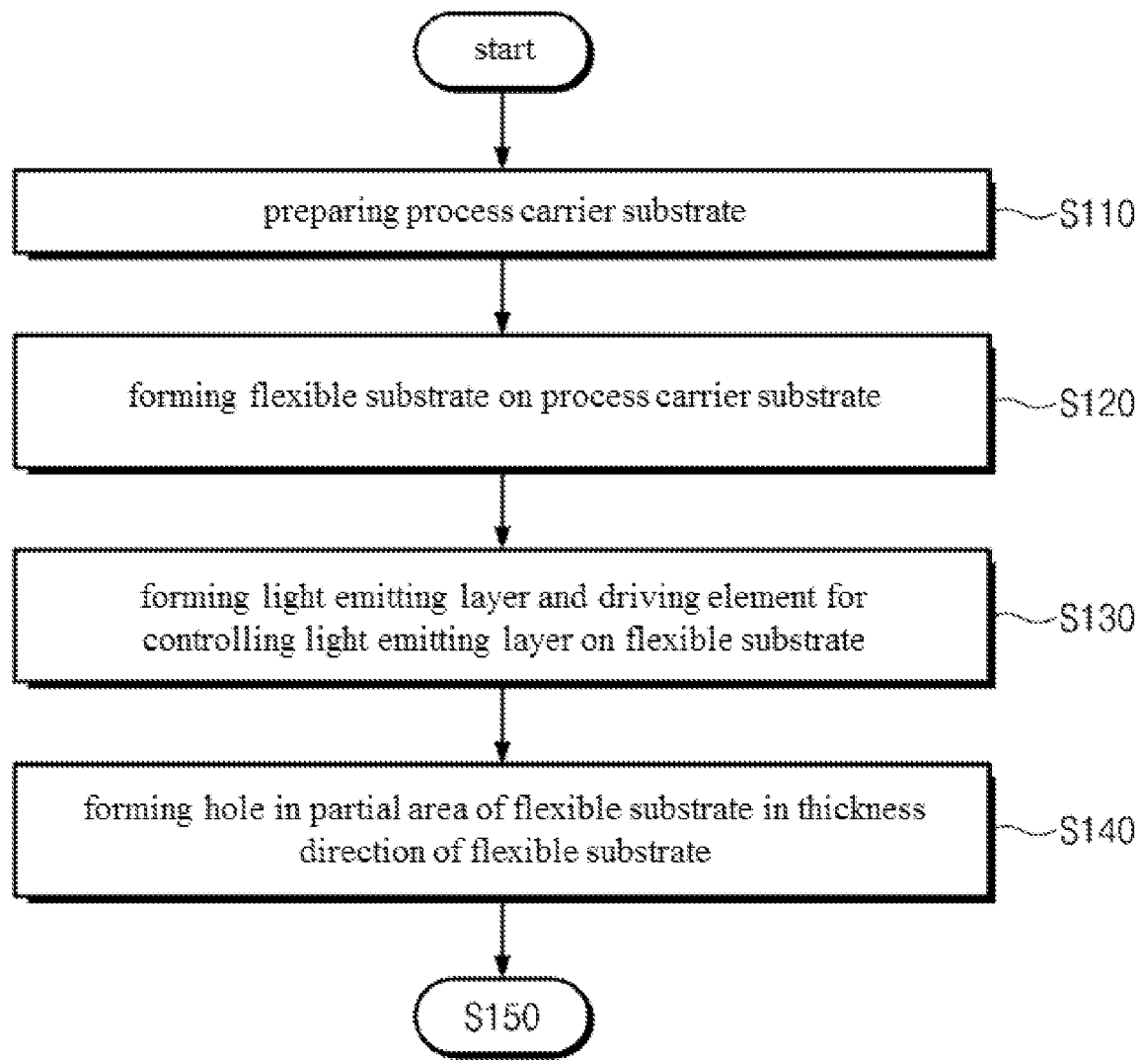

[Fig. 2]
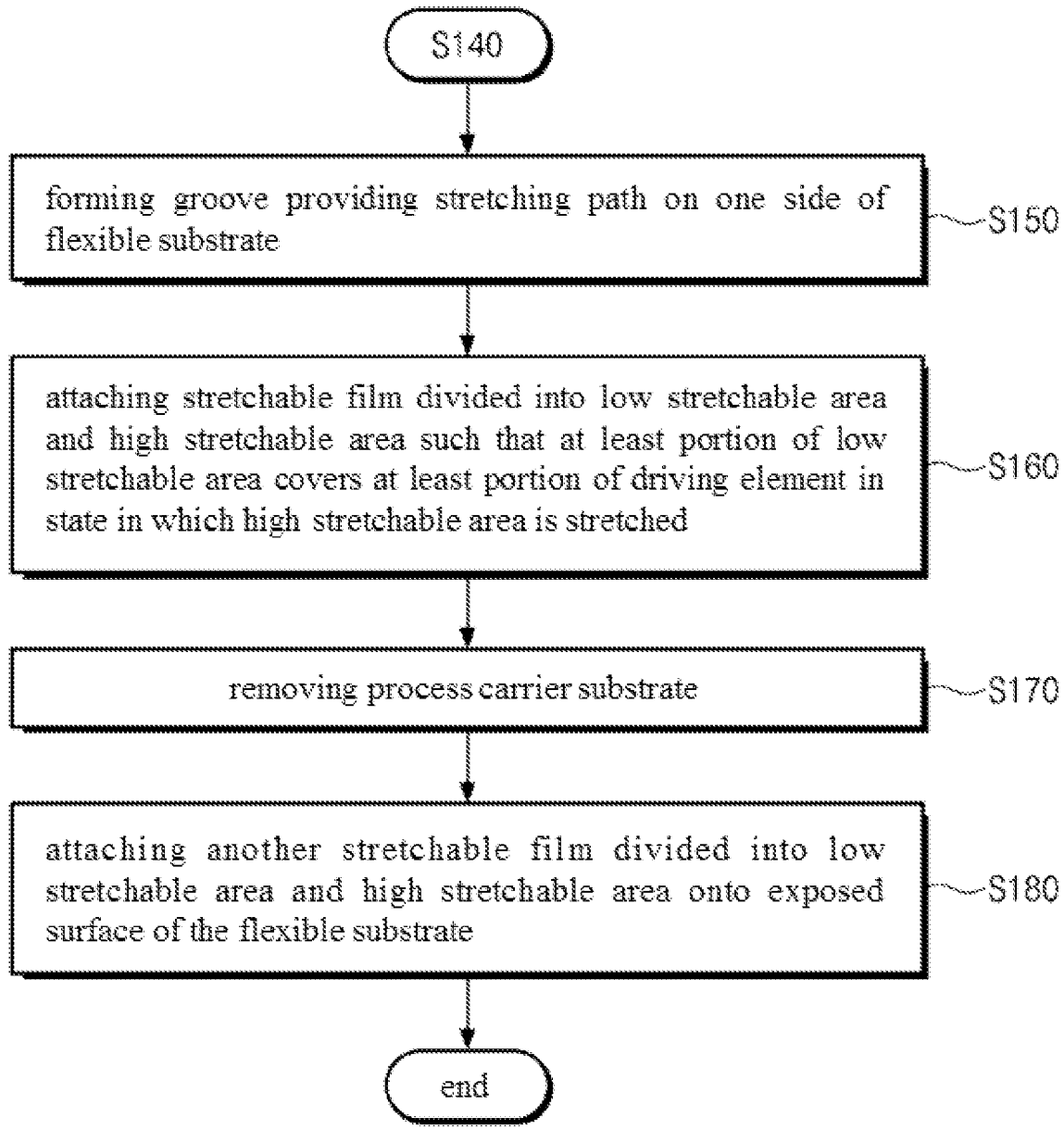

[Fig. 3]
S110 & S120
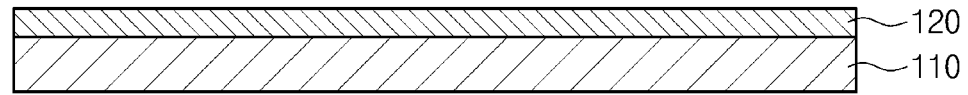

【Fig. 4】
S130
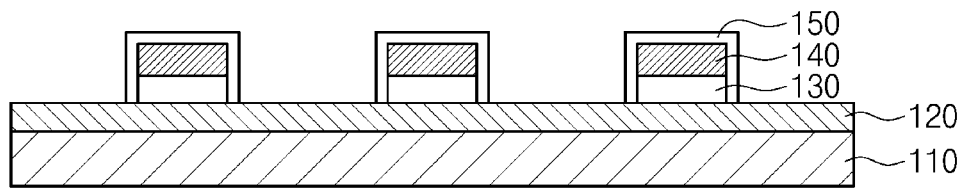

【Fig. 5】
S140
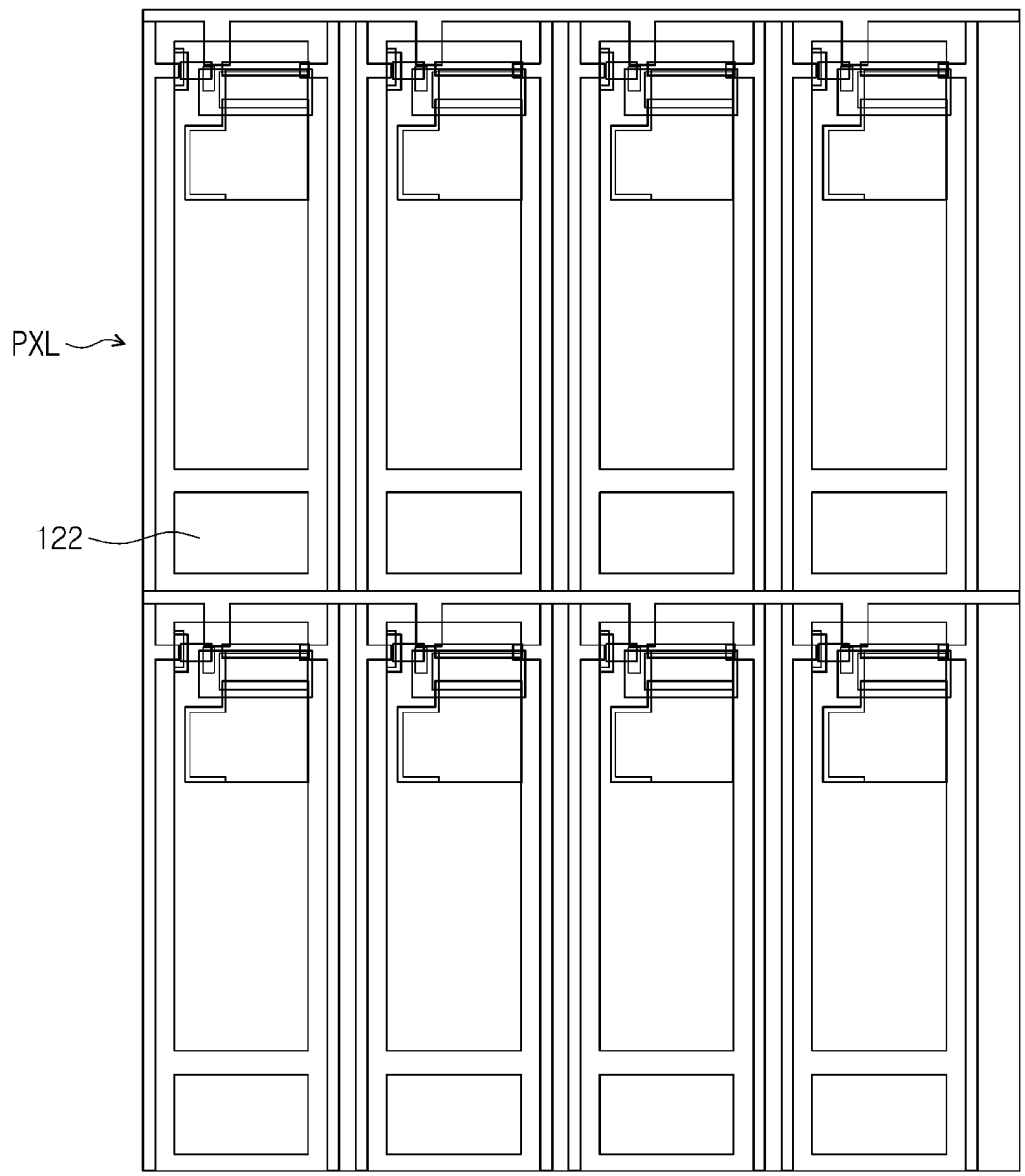

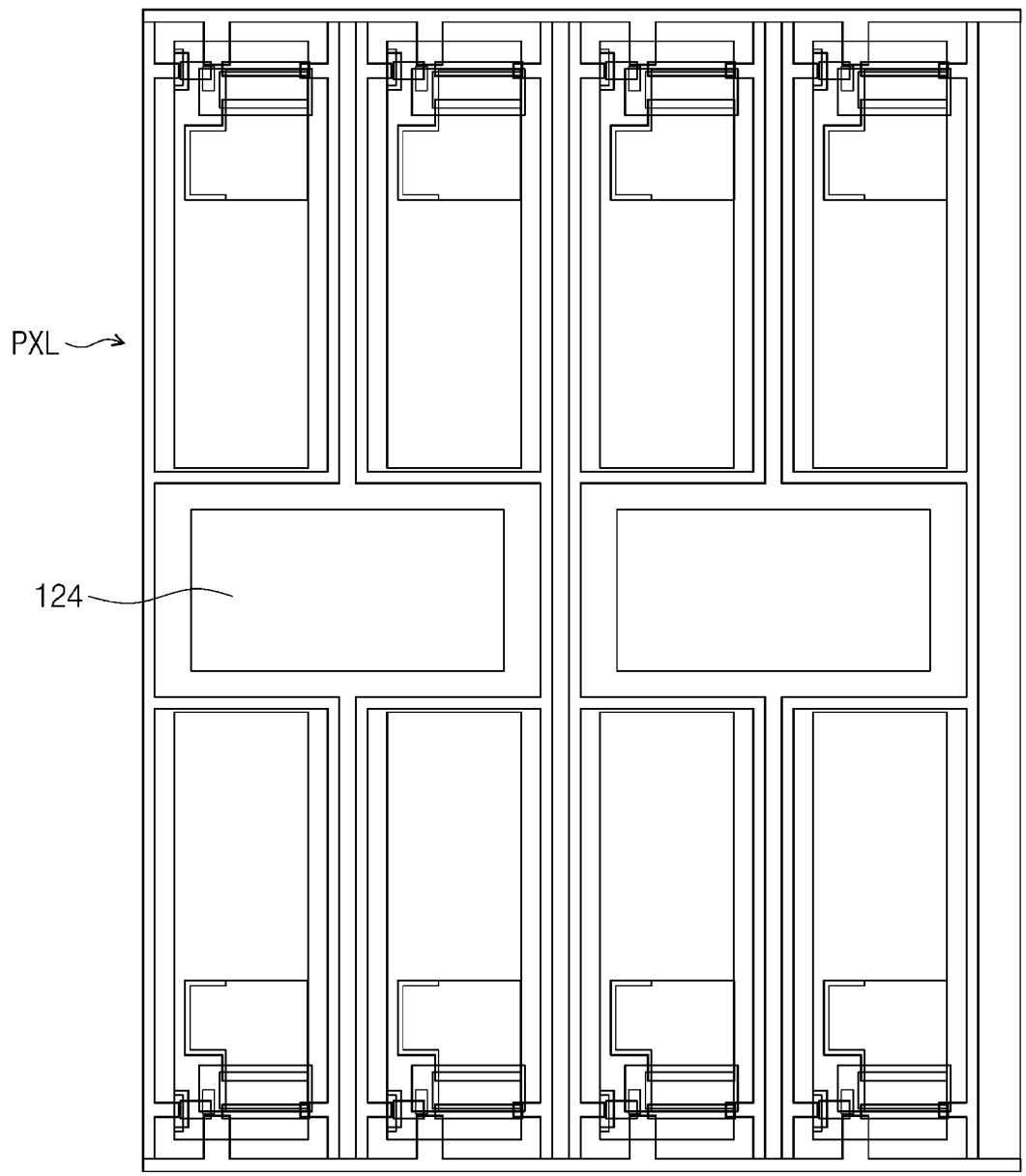
[Fig. 6]

[Fig. 7A]
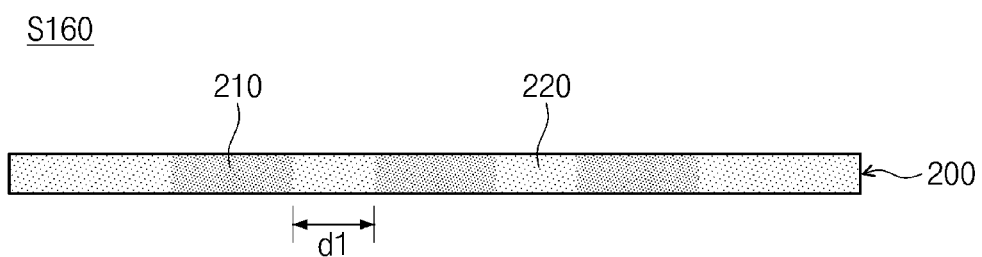
[Fig. 7B]
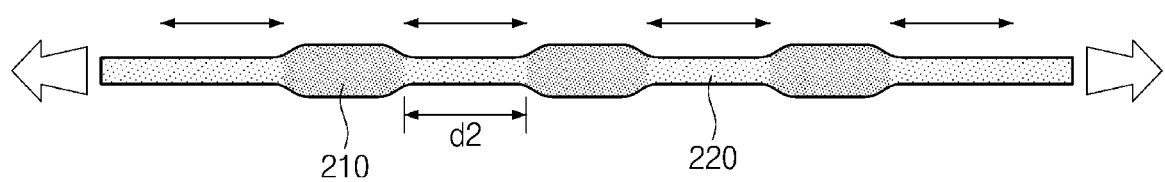

[Fig. 8]
S160
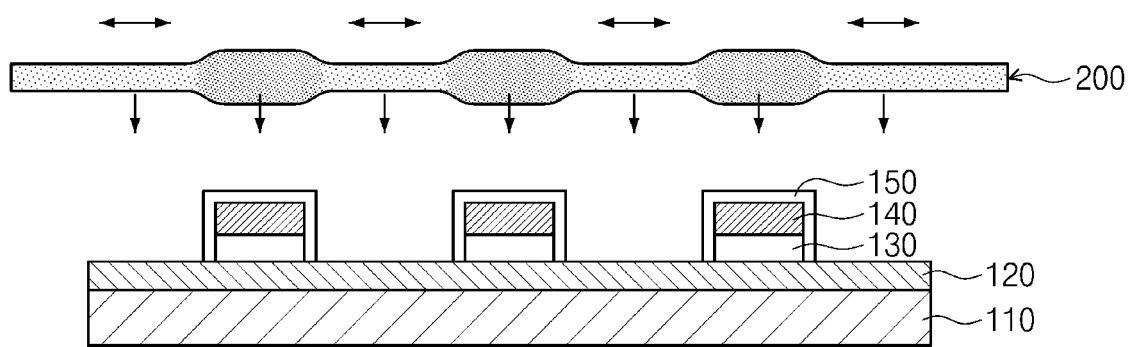

[Fig. 11]
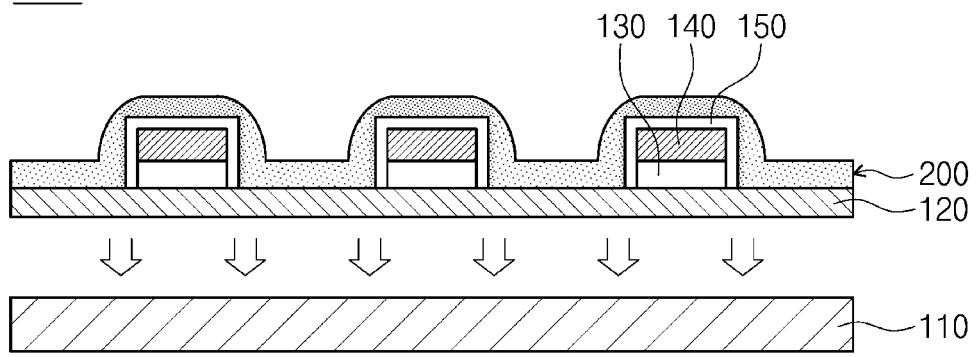

[Fig. 12]
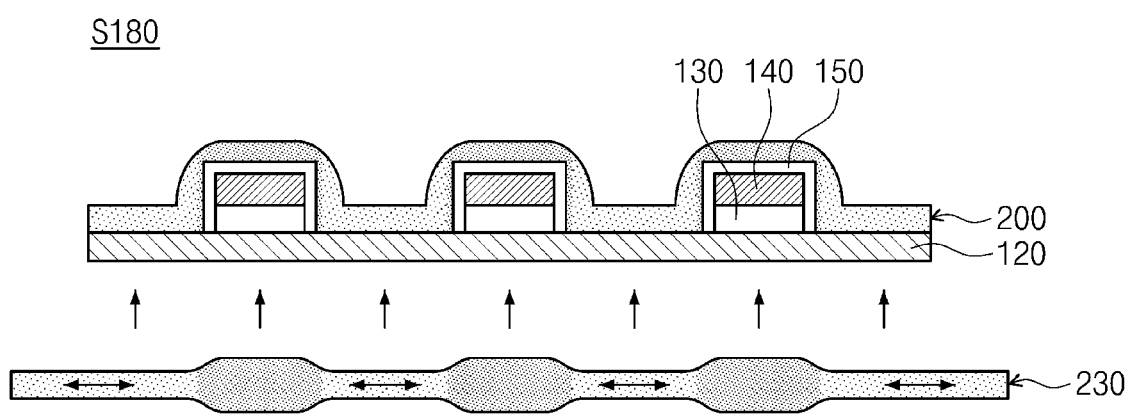

【Fig. 13A】
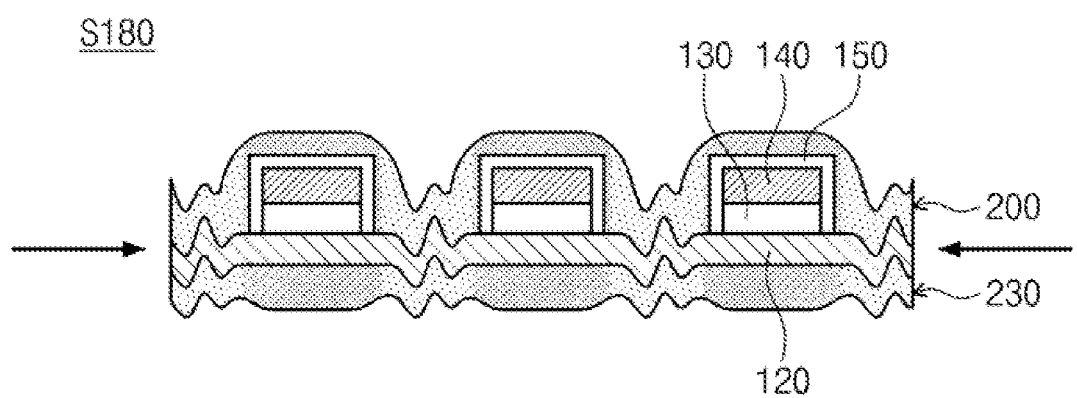
【Fig. 13B】
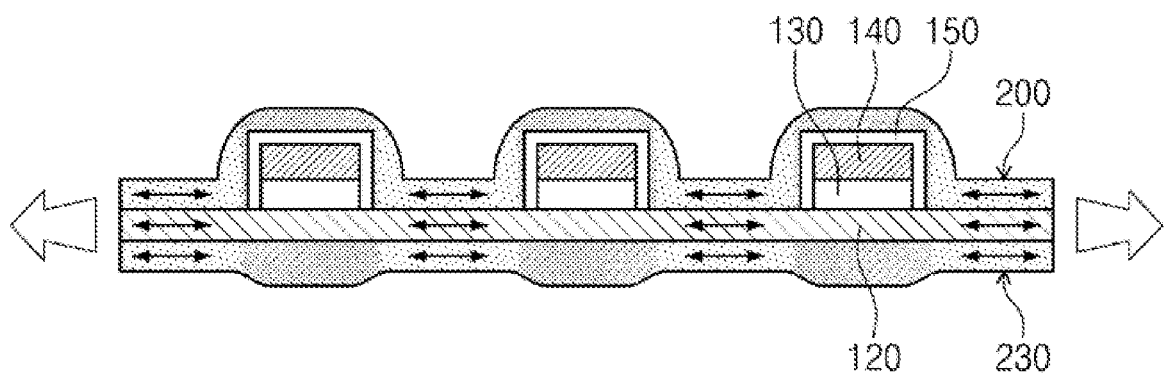

STRETCHABLE DISPLAY AND THE MANUFACTURING METHOD THEREOF

BACKGROUND OF THE INVENTION

1. Field of the Invention

The present invention relates to a stretchable display and a method of manufacturing the same, and more particularly, to a stretchable display having excellent compatibility with a mass production process of an existing flexible display and a method of manufacturing the same.

2. Description of the Prior Art

Conventional displays simply refer to devices that output electrical signals in a visual form. However, in recent years, displays have been developed as devices that not only display information, but represent flexible characteristics.

A flexible display is advanced into a bendable stage that can be bent and curved, a rollable stage that can be rolled like a scroll, and a foldable stage that can be folded like a paper. Meanwhile, more recently, the display continues to advance into a stretchable stage that can be scaled up or down while being stretched or shrunken in one or two axes.

In particular, the stretchable display is spotlighted because the stretchable display is suitable for market characteristics that require stretchability, such as wearable devices.

However, in order to manufacture the stretchable display, various technical problems have to be solved. According to a conventional stretchable display manufacturing method, a substrate having excellent stretchability is prepared, and a light emitting layer and a driving element are formed on the prepared substrate. However, the reliability of whether a substrate having excellent stretchability can serve as a stable substrate during a light emitting layer deposition process and a driving element deposition process is not secured. That is, in order to be applied to the mass production process of the displays, various other requirements have to be satisfied in addition to stretchability, but an appropriate stretchable substrate has not yet been developed.

In this regard, the present inventors have invented a stretchable display that is simple and has excellent compatibility with a conventional flexible display process and a method of manufacturing the same.

SUMMARY OF THE INVENTION

One technical problem to be solved by the present invention is to provide a stretchable display having excellent compatibility with a flexible display process and a method of manufacturing the same. Another technical problem to be solved by the present invention is to provide a stretchable display having a simple manufacturing process and a method of manufacturing the same.

Still another technical problem to be solved by the present invention is to provide a stretchable display that provides high reliability in a stretchable environment and a method of manufacturing the same.

Still another technical problem to be solved by the present invention is to provide a stretchable display having excellent economic efficiency and a method of manufacturing the same.

Still another technical problem to be solved by the present invention is to provide a stretchable display that has high stretchability and minimizes degradation of image quality, and a method of manufacturing the same.

The technical problems to be solved by the present invention are not limited to the above.

A method of manufacturing a stretchable display according to an embodiment of the present invention includes: preparing a process carrier substrate; forming a flexible substrate on the process carrier substrate; forming a light emitting layer and a driving element controlling the light emitting layer on the flexible substrate; and attaching a stretchable film divided into a low stretchable area and a high stretchable area such that at least a part of the low stretchable area covers at least a part of the driving element in a state in which the high stretchable area is stretched.

According to one embodiment, in the attaching of the stretchable film, the stretchable film may be attached such that the high stretchable area covers at least a part of the light emitting layer.

According to one embodiment, in the attaching of the stretchable film, the stretchable film may be attached such that the low stretchable area covers the light emitting layer and the driving element, and the high stretchable area covers a wiring connected to the driving element.

According to one embodiment, the flexible substrate may be formed of polyimide.

According to one embodiment, the method may further include: forming an encapsulation layer for protecting the light emitting layer, before the attaching of the stretchable film.

According to one embodiment, the method may further include: removing the process carrier substrate.

According to one embodiment, the method may further include: forming a groove providing a stretching path on one surface of the flexible substrate According to one embodiment, the method may further include: forming a hole in at least a partial area of the flexible substrate corresponding to the high stretchable area in a thickness direction of the flexible substrate.

According to one embodiment, the method may further include: attaching another stretchable film divided into a low stretchable area and a high stretchable area onto an exposed surface of the flexible substrate, after the process carrier substrate is removed.

According to one embodiment, a product of a modulus and a thickness of the high stretchable area of the stretchable film may be greater than a product of a modulus and a thickness of the flexible substrate.

A stretchable display according to one embodiment of the present invention includes a flexible substrate; a light emitting layer formed on one surface of the flexible substrate; a driving element formed on one surface of the flexible substrate to control the light emitting layer; and a stretchable film provided on at least one of one surface and the other surface of the flexible substrate and divided into a low stretchable area covering at least a part of the driving element and a high stretchable area providing a stretchable property.

According to one embodiment, the high stretchable area may cover at least a part of the light emitting layer According to one embodiment, the low stretchable area may cover the light emitting layer and the driving element, and the high stretchable area may cover a wiring connected to the driving element.

According to one embodiment, the wiring may be formed of an amorphous metal According to one embodiment, the flexible substrate may be formed of polyimide According to one embodiment, a difference in modulus between the low stretchable area and the high stretchable area of the stretchable film may be 10 times or more.

According to one embodiment, a product of a modulus and a thickness of the high stretchable area of the stretchable film may be greater than a product of a modulus and a thickness of the flexible substrate, According to one embodiment, a hole may be formed in at least a partial area of the flexible substrate facing the high stretchable area.

According to one embodiment, a groove providing a stretching path may be formed on the other surface of the flexible substrate.

According to one embodiment, the stretchable film may be formed on an encapsulation layer that protects the light emitting layer.

According to an embodiment of the present invention, since a substrate of a conventional flexible display can be used as a substrate of a stretchable display, excellent mass production can be attained.

According to an embodiment of the present invention, a stretchable film is attached in a stretched state such that a low stretchable area of the stretchable film corresponds to a driving element, and a high stretchable area of the stretchable film corresponds to a light emitting layer and/or a wiring. Thus, external force that may be applied to the driving element in the stretchable environment can be minimized.

According to an embodiment of the present invention, a stretchable path may be provided by forming holes or grooves in the substrate.

The effects of the present invention may not be limited to those described above.

BRIEF DESCRIPTION OF THE DRAWINGS

FIGS. 1 and 2 are flowcharts illustrating a method of manufacturing a stretchable display according to an embodiment of the present invention.

FIG. 3 is a view for explaining steps S110 and S120 of a method of manufacturing a stretchable display according to an embodiment of the present invention.

FIG. 4 is a view for explaining step S130 of a method of manufacturing a stretchable display according to an embodiment of the present invention.

FIGS. 5 and 6 are views for explaining step S140 of a method of manufacturing a stretchable display according to an embodiment of the present invention.

FIGS. 7A, 7B, 8, 9 and 10 are views for explaining step S160 of a method of manufacturing a stretchable display according to an embodiment of the present invention.

FIG. 11 is a view for explaining step S170 of a method of manufacturing a stretchable display according to an embodiment of the present invention.

FIGS. 12, 13A and 13B are views for explaining step S180 of a method of manufacturing a stretchable display according to an embodiment of the present invention.

DETAILED DESCRIPTION OF THE EMBODIMENTS

Figure 9:
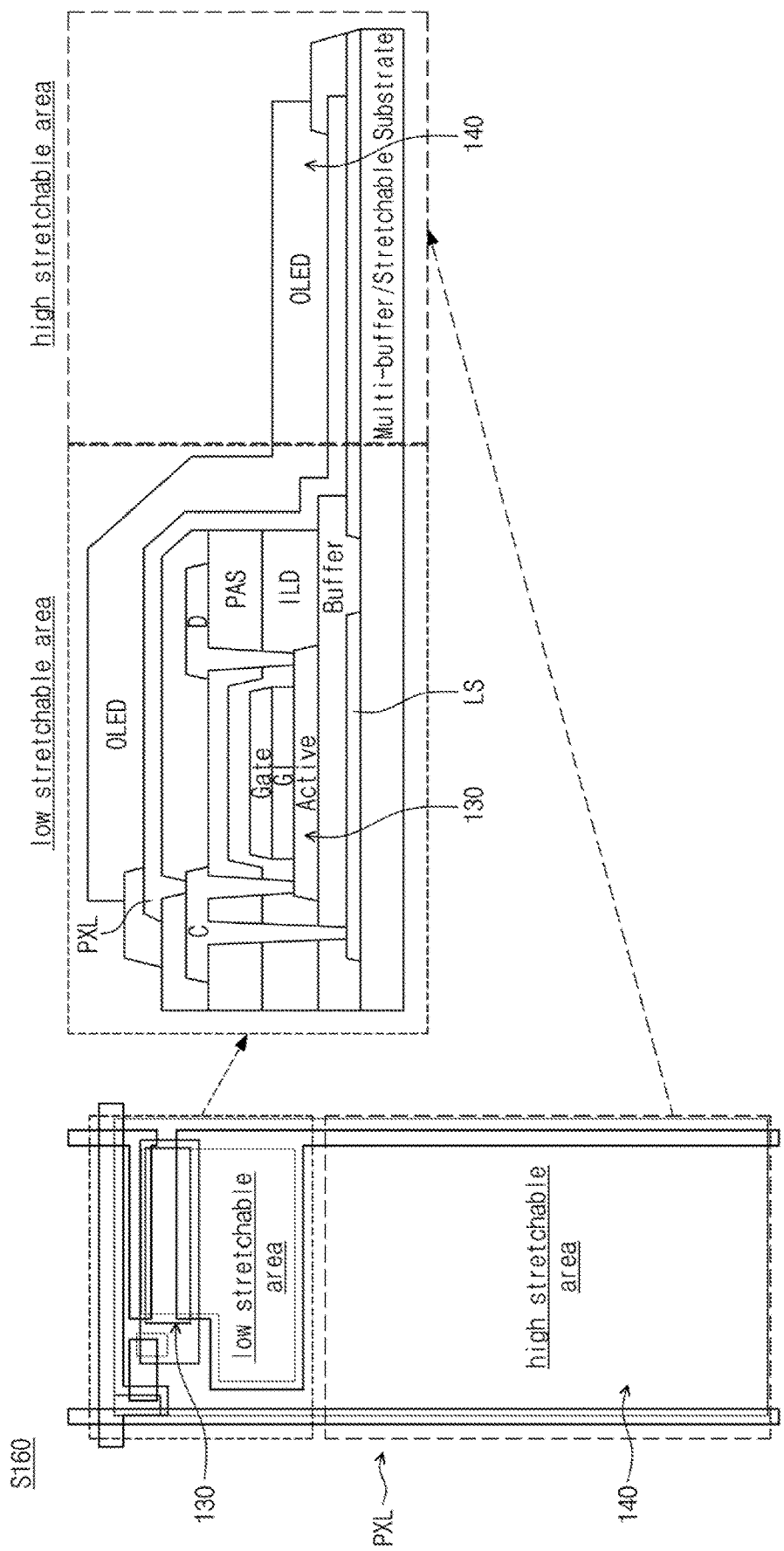

Hereinafter, embodiments of the present invention will be described in detail with reference to the accompanying drawings. However, the technical idea of the present invention is not limited to the embodiments described herein and may be embodied in other forms. Rather, the embodiments introduced herein are provided so that the disclosed contents may be thorough and complete, and the spirit of the present invention may be sufficiently transmitted to those skilled in the art.

In the present specification, when a component is referred to as being on another component, it means that it may be formed directly on the other component or that a third component may be interposed therebetween. In addition, in the drawings, thicknesses of films and areas may be exaggerated for effective explanation of the technical contents.

Further, in various embodiments of the present specification, terms such as first, second, and third are used to describe various components, but these components should not be limited by these terms. These terms are only used to distinguish one component from other components. Accordingly, a first component referred in one embodiment may be referred to as a second component in another embodiment. Each embodiment described and illustrated herein also includes its complementary embodiment. In addition, in the present specification, the term 'and/or' is used to include at least one of the components listed before and after.

In the specification, expressions in the singular include plural expressions unless the context clearly indicates otherwise. In addition, terms such as "comprise" or "have" are intended to designate the presence of features, numbers, steps, components, ora combination thereof and do not intend to exclude the possibility of the presence or addition of one or more other features, numbers, steps, components and combination thereof. In addition, in the present specification, the term "connection" is used to include both indirect connection and direct connection of a plurality of components.

Further, in the following description of the present invention, if it is determined that a detailed description of a known function or configuration may unnecessarily obscure the subject matter of the present invention, the detailed description will be omitted.

FIGS. 1 and 2 are flowcharts illustrating a method of manufacturing a stretchable display according to an embodiment of the present invention, and FIGS. 3 to 13 are views for explaining each step of a method of manufacturing a stretchable display according to an embodiment of the present invention in detail.

Referring to FIGS. 1 and 2, a method of manufacturing a stretchable display according to an embodiment of the present invention may include at least one of the steps of preparing a process carrier substrate (S110), forming a flexible substrate on the process carrier substrate (S120), forming a light emitting layer and a driving element for controlling the light emitting layer on the flexible substrate (S130), forming a hole in a partial area of the flexible substrate in a thickness direction of the flexible substrate (S140), forming a groove providing a stretching path on one side of the flexible substrate (S150), attaching a stretchable film divided into a low stretchable area and a high stretchable area such that at least a portion of the low stretchable area covers at least a portion of the driving element in a state in which the high stretchable area is stretched (S160), removing the process carrier substrate (S170), and attaching another stretchable film divided into a low stretchable area and a high stretchable area onto an exposed surface of the flexible substrate (S180). Hereinafter, each step will be described in detail.

Step S110

In step S110, a process carrier substrate may be prepared.

The process carrier substrate 110 may have a function of supporting the flexible substrate 120 so that various types of elements can be formed on the flexible substrate 120 formed on an upper surface of the process carrier substrate 110.

For this purpose, the process carrier substrate 110 may be formed of a material capable of providing a predetermined supporting force to the flexible substrate 120, for example, a material including at least one of glass, plastic, metal plate, and silicon wafer. The material of the process carrier substrate 110 is only an example, and is not limited to the above materials.

Step S120

In step S120, as shown in FIG. 3, the flexible substrate 120 may be formed on the process carrier substrate 110.

The flexible substrate 120 may be formed of a material used in a conventional flexible display manufacturing process, for example, a material including at least one of polyimide, polyethylene terephthalate (PET), and polyethylenenaphthalate (PEN).

The flexible substrate 120 may be formed of a high heat-resistant polymer layer having low stretchability.

In addition, the flexible substrate 120 may be formed of a photosensitive polymer including photosensitive polyimide.

Alternatively, the flexible substrate 120 may be formed of a non-photosensitive polymer material. A process of forming a hole in the thickness direction of the flexible substrate 120 may depend on the material of the flexible substrate 120, and a detailed description thereof will be described in step S140.

The flexible substrate 120 may be formed of a material having lower stretchability than that of a stretchable film to be described below. For example, the stretchability of the flexible substrate 120 may be lower than that of the high stretchable area of the stretchable film. In this case, the stretchability may refer to the degree of deformation with respect to a pulling force in the plane direction.

The flexible substrate 120 may have a thickness of 10 μm or less, for example, 5 μm or less.

The flexible substrate 120 may be formed on the process carrier substrate 110 in various ways, and the process carrier substrate 110 may be lifted off from the flexible substrate 120 in a subsequent process. For example, the flexible substrate 120 may be bonded onto the process carrier substrate 110 by using a double-sided adhesive. In this case, the double-sided adhesive may have adhesive strength that varies depending on the temperature. For example, the double-sided adhesive may be formed of a material having a property of losing adhesive strength at the temperature of −30° C. or below. Alternatively, the flexible substrate 120 may be formed on the process carrier substrate 110 such that the flexible substrate 120 can be separated from the process carrier substrate 110 by a laser.

Step S130

In step S130, as shown in FIG. 4, a light emitting layer 140 and a driving element 130 for controlling the light emitting layer 140 may be formed on the flexible substrate 120.

First, the driving element 130 may be formed on the flexible substrate 120. The driving element may include a transistor and a capacitor capable of controlling the light emitting layer for each pixel. For example, two transistors and one capacitor may be provided per a unit pixel. However, this is for the convenience of explanation, and more transistors and more capacitors may be provided.

The transistor may be formed based on various types of channel layers. The channel layer may have a property of providing high mobility. For example, the transistor may include at least one of an oxide transistor using oxide as a channel layer, a low temperature polysilicon transistor using low temperature polysilicon as a channel layer, an organic transistor using an organic material as a channel layer, and a single crystal transistor using single crystal silicon as a channel layer. The following description will be made on the assumption that the transistor is a low temperature polysilicon transistor for the convenience of explanation.

The transistor may include metal electrodes such as a gate electrode, a source electrode, and a drain electrode.

The driving element 130 may be connected by wirings. The wiring may include, for example, a gate line wiring and a data line wiring. In this case, the gate line wiring may be connected to the gate electrode, and the data line wiring may be connected to the source electrode.

The wiring may be formed of a material having excellent conductivity and stretchability, for example, an amorphous metal. In particular, the wiring may be formed of an amorphous metal alloy. The amorphous metal alloy may include a certain alloy consisting of two or more metals that interfere with the formation of a regular structure with each other and may not be limited to the example of materials mentioned above. For example, the amorphous metal alloy may include at least one of FeZr, CoNi, La—Al Cu, Al—Sc, ZrTiCuNiBe, AuSi, CuZr, CuPd, CuCo, CuPdCoP, PdAgSi, PdAgSiP, PdAgSiGe, PtCuAgPBSi, CuZrTi, CuZrTiNi, and CuZrTiAlBe.

As another example, the wiring may be formed of a low resistance material that can be bent. For example, the wiring may be formed of at least one of aluminum, silver, and copper.

In this case, the wiring may be prepared in the form of a double layer in which a low resistance material wiring is formed on an amorphous metal alloy wiring.

In addition, the wiring may have a characteristic that the resistance is maintained within 1.5 times at the maximum 10% elongation.

Meanwhile, in step S130, the light emitting layer 140 may be formed on the flexible substrate 120.

The light emitting layer 140 may include at least one of a hole injection layer (HIL), a hole transport layer (HTL), an organic layer (EL), an electron transport layer (ETL), and an electron injection layer (EIL). The light emitting layer 140 may also have stretchability. In this case, a change in quality characteristics may be maintained at 25% or less in a state in which the light emitting layer 140 is stretched by 10%.

According to an embodiment, a first electrode electrically connected to the drain electrode of the transistor may be formed before the light emitting layer 140 is formed. The first electrode may serve as an anode or a cathode with respect to the light emitting layer 140. In the following description, it is assumed that the first electrode serves as an anode for the convenience of explanation. In this case, the light emitting layer 140 may be stacked on the first electrode in the order of a hole injection layer (HIL), a hole transport layer (HTL), an organic layer (EL), an electron transport layer (ETL), and an electron injection layer (EIL).

In this case, the first electrode may be provided for each pixel. In addition, an organic bank for classifying the pixels may be formed on the first electrode. The light emitting layer 140 may be formed after the organic bank is formed.

The light emitting layer 140 may be formed in various ways. For example, the light emitting layer 140 may be formed through a vapor deposition method using a shadow mask. Alternatively, at least one of the light emitting layer 140 may be transferred onto the driving element.

A second electrode may be formed on the light emitting layer 140. When the first electrode serves as an anode, the second electrode may serve as a cathode.

Step S130 may further include the step of forming an encapsulation layer 150. In this case, the encapsulation layer 150 may be formed for each unit pixel. The encapsulation layer 150 may block moisture and air so that the moisture and air may not penetrate into the light emitting layer 140.

To this end, the encapsulation layer 150 may be prepared as an organic-inorganic composite layer including inorganic and organic materials. For example, the encapsulation layer 150 may include at least one of a carbon-based inorganic material such as graphene oxide and carbon nanotube (CNT), and acryl-based, siloxane-based, urethane-based, and ethylene/propylene/diene-based elastomeric polymer resin films.

Step S140

In step S140, a hole may be formed in a partial area of the flexible substrate 120 in the thickness direction of the flexible substrate 120.

When the flexible substrate 120 is formed of a non-photosensitive material in step S120, the hole may be formed in the flexible substrate 120 in the thickness direction through a photolithography process and a subsequent etching process, for example, a dry etching process in step S140.

Since the hole is formed in the flexible substrate having low stretchable properties, excellent stretchable properties can be provided even if a state change between the stretched state and the contracted state of the flexible substrate 120 occurs. More specifically, the hole may be formed in at least a partial area of the flexible substrate 120 facing the high stretchable area 220. The hole may be formed in various shapes and sizes.

For example, as shown in FIG. 5, the hole 122 may be provided for each unit pixel PXL under the light emitting layer. As another example, a single hole 124 may be provided in two neighboring pixels adjacent to each other as shown in FIG. 6.

If the flexible substrate 120 is formed of photosensitive polyimide in step S120, the hole may be formed in the flexible substrate 120 in the thickness direction through a photo process in step S120. That is, when the flexible substrate 120 is formed of photosensitive polyimide, the hole may be formed before the driving element 130 and the light emitting layer 140 are formed in step S130. More specifically, after the flexible substrate 120 is formed on the process carrier substrate 110 and before the driving element 130 and the light emitting layer 140 are formed, the hole may be formed in the flexible substrate 120. This is to prevent the photosensitive polyimide from being damaged during the process for forming the driving element 130 and the light emitting layer 140 (that is, during step S130). Even in this case, the hole formed in the flexible substrate 120 may have the position and shape described with reference to FIGS. 5 and 6.

Accordingly, the stretchable property may be further improved by step S140.

Step S150

In step S150, a groove providing a stretching path may be formed on one surface of the flexible substrate 120. When the groove is formed in the flexible substrate 120 by step S150, a stretching path may be provided to allow the flexible substrate to be contracted in a certain shape when it is contracted from a stretched state.

To this end, a laser for forming a groove pattern may be irradiated onto one surface of the flexible substrate 120. More specifically, the laser may form a groove on one surface of the flexible substrate 120 by passing through the process carrier substrate 110. In this case, the laser for forming the groove pattern may be selected as light having a characteristic of passing through the process carrier substrate 110 while being absorbed in the flexible substrate 120 to form the groove. The laser for forming the groove pattern may form the groove by decomposing a fine area on the surface of the flexible substrate 120. The depth or width of the groove may be adjusted depending on the intensity of the laser or the degree of focusing.

According to another example, after the process carrier substrate 110 is separated from the flexible substrate 120, the groove may be formed on the exposed surface.

Step S160

In step S160, the stretchable film 200 may be attached.

For this purpose, as shown in FIG. 7A, a stretchable film 200 may be prepared. The stretchable film 200 may include a low stretchable area 210 and a high stretchable area 220. For example, the high stretchable area 220 may surround the low stretchable area 210 on a plane, so that the low stretchable area 210 may have an island shape. The sizes and shapes of the low stretchable area 210 and the high stretchable area 220 may vary according to a design of a person skilled in the art.

The low stretchable area 210 may be defined as an area having low stretchability compared to the high stretchable area 220. For example, the difference in modulus between the low stretchable area and the high stretchable area of the stretchable film may be 10 times or more. More specifically, a difference in modulus between the low stretchable area and the high stretchable area of the stretchable film may be 50 times or more.

Accordingly, when the stretchable film 200 is pulled in the plane direction, the high stretchable area 220 may be stretched from d1 of FIG. 7A to d2 of FIG. 7B.

The stretchable film 200 may be manufactured in various ways. For example, a solution capable of producing the stretchable film may be casted on a glass or a metal plate and dried to form a film. Then, the film is locally subject to UV curing or cured after another material is added thereto, thereby forming the low stretchable area. In this case, the UV curing or a process of adding another material may be applied before the film casted on the glass or metal plate is completely dried, and the process of adding another material is disclosed in Korean Patent No. 10-2017-0087162.

As shown in FIG. 8, the prepared stretchable film 200 may be attached onto the flexible substrate 120 on which the driving element 130, the light emitting layer 140, and the encapsulation layer 150 are formed. In this case, the stretchable film 200 may be attached while being pulled in the plane direction, for example, in a state stretched along both axes by at least 20%. According to an example, when the low stretchable area and the high stretchable area are provided as shown in FIG. 9 to be described below, the high stretchable area may be attached while being stretched by 67%, and when the low stretchable area and high stretchable area are provided as shown in FIG. 10 to be described below, the high stretchable area may be attached while being stretched by 29%.

At this point, for example, the stretchable film 200 may be attached by using a double-sided adhesive. The process for attaching the stretchable film 200 in a stretched state is disclosed in Korean Patent No. 10-2017-0087157.

In the attaching process, areas of the stretchable display for attaching the low stretchable area 210 and the high stretchable area 220 of the stretchable film 200 may be considered.

Figure 10:
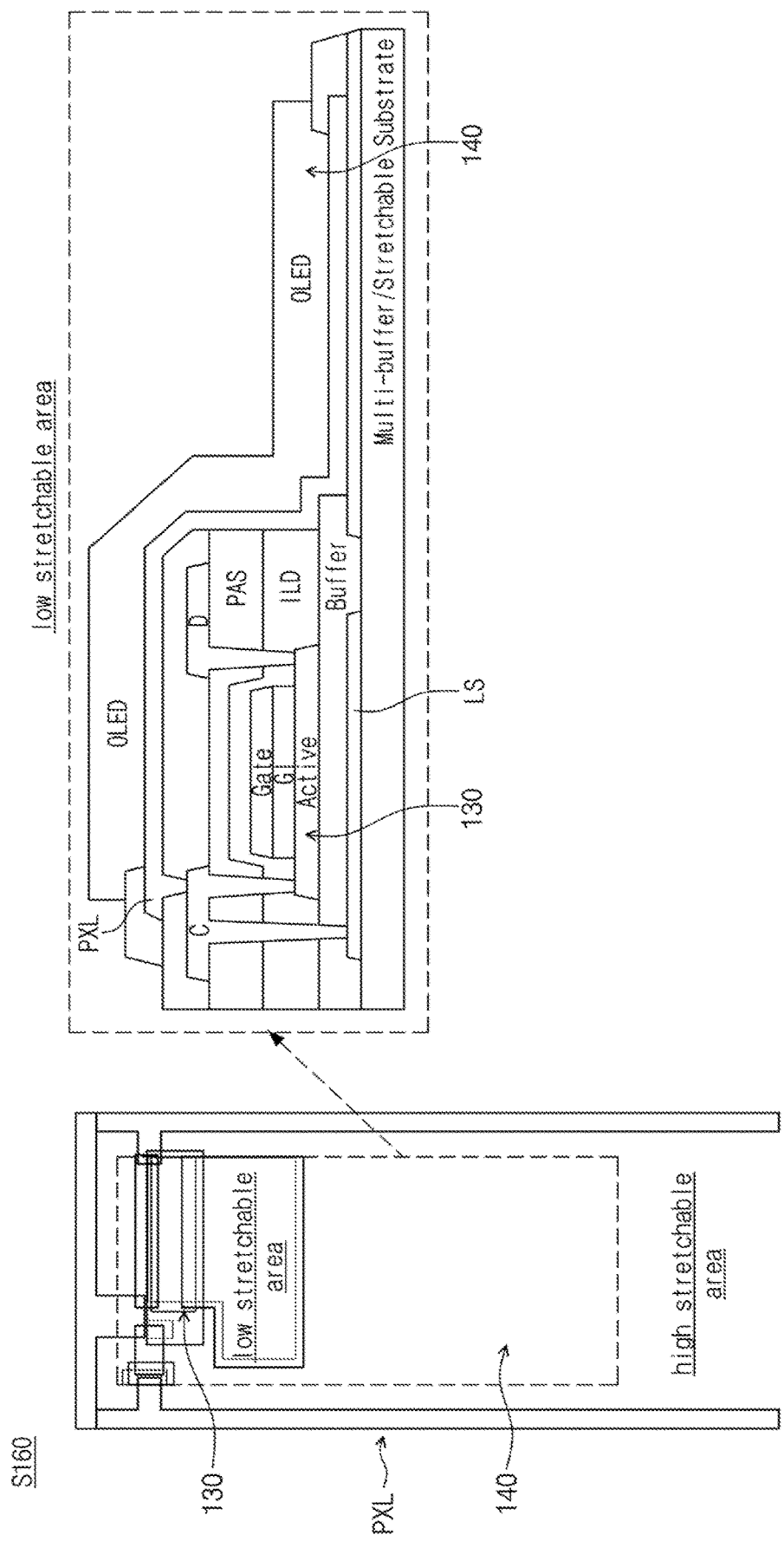

For example, as shown in FIG. 9, the low stretchable area 210 of the stretchable film 200 may be attached to cover the driving element 130, and the high stretchable area 220 of the stretchable film 200 may be attached to cover at least a part of the light emitting layer 140. In this case, since the high stretchable area 220 is formed wide, it is possible to impart improved stretchable property.

In contrast, as shown in FIG. 10, the low stretchable area 210 of the stretchable film 200 may be attached to cover the driving element 130 and the light emitting layer 140, and the high stretchable area 220 may be attached to cover the wiring. In this case, since the low stretchable area 210 is formed wide, the driving element 130 and the light emitting layer 140 may be stably protected even in a stretchable environment.

The low stretchable area 210 and the high stretchable area 220 of the stretchable film 200 may be prepared in advance with a predetermined shape and size in consideration of each situation described with reference to FIGS. 9 and 10.

Meanwhile, in step S160, the stretchable film 200 may be attached in a stretched state as described above. In this case, the low stretchable area 210 may be attached to cover the driving element 130.

Since the stretchable film 200 is attached in the stretched state, when the force pulling the stretchable film 200 in the plane direction is released after completing the subsequent processes, the stretchable wrinkle may be formed about the high stretchable area 220. Thus, stretchable property may be provided.

In addition, since the low stretchable area 210 covers the driving element 130, it is possible to minimize an external force applied to the driving element 130 at the time of release. That is, since the wrinkles due to release are minimized in the low stretchable area 210, the external force applied to the driving element 130 may be minimized. In contrast, when the high stretchable area 220 covers the driving element 130, wrinkles may be generated in the high stretchable area 220 at the time of release, and damage may be applied to the driving element 130 by the generated wrinkles.

In addition, since the high stretchable area 220 covers configurations other than the driving element 130 having low stretchability, the wrinkles may be generated in other configurations along the wrinkles generated in the high stretchable area 220 at the time of release, for example, the wrinkles may be stably generated in the wiring and/or the light emitting layer. Accordingly, high stretchable property may be provided.

Step S170

In step S170, as shown in FIG. 11, the process carrier substrate 110 may be removed.

The process carrier substrate 110 may be removed in various ways. For example, the process carrier substrate 110 may be separated from the stretchable film 200 by irradiating a line beam type laser. As another example, when the process carrier substrate 110 and the stretchable film 200 are bonded to each other by a double-sided tape that loses adhesive strength at the temperature of −30° C. or below, the process carrier substrate 110 may be separated from the stretchable film 200 by providing a low temperature environment.

Step S180

In step S180, as shown in FIG. 12, another stretchable film 230 divided into a low stretchable area 210 and a high stretchable area 220 may be attached onto an exposed surface of the flexible substrate 120.

According to an example, before step S180 is performed, a barrier film for blocking penetration of air and moisture may be attached onto the exposed surface of the flexible substrate 120.

The stretchable film 230 attached onto the exposed surface of the flexible substrate 120 may also be divided into a low stretchable area and a high stretchable area, and these areas may correspond to the low stretchable area and the high stretchable area of the stretch film 200 that has been already attached. In this case, the stretchable film 230 may also be attached through a double-sided adhesive in a stretched state as described above.

That is, the stretchable film may be attached onto both surfaces of the stretchable display according to an embodiment.

The release process may be performed after the stretchable film 230 is attached. The release process may refer to a process of releasing a force pulling the stretchable films 200 and 230 in the plane direction during the manufacturing process.

Accordingly, as shown in FIG. 13A, stretching wrinkles may be generated in the high stretchable area as the stretched high stretchable area is contracted again. Stretching wrinkles may also be formed in the wiring and/or the light emitting layer overlapping the high stretchable area by the wrinkles generated in the high stretchable area.

According to an example, the contraction force of the stretchable films 200 and 230 may be greater than the contraction force of the flexible substrate 120 in order to allow the stretching wrinkles to be easily generated when the stretched high stretchable area shrinks is contacted again during the release process. To this end, the product of the modulus and the thickness of the stretchable film 200 may be greater than the product of the modulus and the thickness of the flexible substrate 120. In addition, the product of the modulus and the thickness of the stretchable film 230 may be greater than the product of the modulus and the thickness of the flexible substrate 120. Accordingly, the flexible substrate 120 may also be contracted due to the contraction of the stretchable films 200 and 230.

When the stretchable display according to an embodiment is pulled in the plane direction later, the high stretchable area may be stretched as shown in FIG. 13B, so that the stretchable property may be provided.

As a result, the stretchable display may be provided according to the manufacturing method of an embodiment of the present invention described with reference to FIGS. 1 to 13.

In the above description with reference to FIGS. 1 to 13, it is assumed that each step is sequentially performed, but, unlike this, the order of each step may be changed as necessary. Furthermore, some of the steps may be omitted.

In addition, in the foregoing description of an embodiment of the present invention, it is assumed that the stretchable film is formed on both upper and lower surfaces of the flexible substrate, but the stretchable film may be formed on at least one of the upper and lower surfaces of the flexible substrate. That is, the stretchable film may be provided only on the upper surface or the lower surface of the driving element, the light emitting layer, and the encapsulation layer formed on the flexible substrate.

Meanwhile, according to an example, after step S180, subsequent processes such as a process of cutting into a size of a unit panel, and a module process may be performed. In this case, the process of cutting into a size of a unit panel may be performed immediately before the process of removing the carrier substrate.

In addition, a part of the stretchable film may be removed on the outer portion of the stretchable display according to an embodiment, and a driving circuit element may be formed. The driving circuit element may apply various signals to the driving element. The driving circuit element may be prepared in the form of a semiconductor chip or a film. In this case, the semiconductor chip having low stretchability may be formed to overlap the low stretchable area, and the film having excellent stretchability may be formed to overlap the high stretchable area.

Although it is not disclosed in the description of the embodiments of the present invention, the embodiments of the present invention may be applied to a top emission type stretchable display or a bottom emission type stretchable display.

According to an embodiment of the present invention described above, the process for preparing a process carrier substrate, forming a flexible substrate on the process carrier substrate, and forming a driving element, a light emitting layer, and an encapsulation layer on the flexible substrate may correspond to the process for forming the conventional flexible display. Therefore, the conventional mass production process may also be used in the stretchable display manufacturing process, so that excellent compatibility for mass production may be provided. In other words, the present invention may contribute to the mass production because existing production facilities can be used.

Further, according to an embodiment of the present invention, a stretchable film is attached in a state in which the high stretchable area is stretched such that the low stretchable area corresponds to a driving element having low stretchability, that is, a TFT, so the stress stability and stretchable property of the element may be improved.

That is, since the low stretchable area is attached in correspondence with the driving element, external stress applied to the driving element may be minimized even in a stretchable environment. This is because the stretching and contraction hardly occur in the low stretchable area under the stretchable environment, so the low stretchable area may block the stress applied to the driving element.

In addition, since the contraction force of the high stretchable area of the stretchable film is greater than that of the flexible substrate, the contraction wrinkles are naturally generated in the flexible substrate when the contraction wrinkles are generated in the high stretchable area under a stretchable environment. That is, the low stretchable property of the flexible substrate typically formed of polyimide may be supplemented by the stretchable property provided by the high stretchable area of the stretchable film.

In addition, according to an embodiment of the present invention, an amorphous alloy having excellent stretchable property is used as a wiring material, a hole is provided in a partial area of the flexible substrate, and a groove is formed on one side of the flexible substrate. Thus, more excellent stretchable property may be provided by the structural features.

Accordingly, the stretchable display according to an embodiment of the present invention may maintain a rate of change of display characteristics within 25% even if it is stretched within a maximum of 20% in any direction on the plane.

The present invention has been described above in detail with reference to preferred embodiments, but the scope of the present invention is not limited to specific embodiments, and should be interpreted by the appended claims. In addition, those skilled in the art may understand that many modifications and variations can be made without departing from the scope of the present invention.

What is claimed is:

1. A method of manufacturing a stretchable display, the method comprising:
   preparing a process carrier substrate;
   forming a flexible substrate on the process carrier substrate;
   forming a light emitting layer and a driving element controlling the light emitting layer on the flexible substrate; and
   attaching a stretchable film divided into a low stretchable area and a high stretchable area such that at least a part of the low stretchable area covers at least a part of the driving element in a state in which the high stretchable area is stretched.

2. The method of claim 1, wherein, in the attaching of the stretchable film, the stretchable film is attached such that the high stretchable area covers at least a part of the light emitting layer.

3. The method of claim 1, wherein, in the attaching of the stretchable film, the stretchable film is attached such that the low stretchable area covers the light emitting layer and the driving element, and the high stretchable area covers a wiring connected to the driving element.

4. The method of claim 1, wherein the flexible substrate is formed of polyimide.

5. The method of claim 1, further comprising:
   forming an encapsulation layer for protecting the light emitting layer, before the attaching of the stretchable film.

6. The method of claim 1, further comprising:
   removing the process carrier substrate.

7. The method of claim 1, further comprising:
   forming a groove providing a stretching path on one surface of the flexible substrate.

8. The method of claim 1, further comprising:
   forming a hole in at least a partial area of the flexible substrate corresponding to the high stretchable area in a thickness direction of the flexible substrate.

9. The method of claim 6, further comprising:
   attaching another stretchable film divided into a low stretchable area and a high stretchable area onto an exposed surface of the flexible substrate, after the process carrier substrate is removed.

10. The method of claim 1, wherein a product of a modulus and a thickness of the high stretchable area of the stretchable film is greater than a product of a modulus and a thickness of the flexible substrate.

11. A stretchable display comprising:
    a flexible substrate;
    a light emitting layer formed on one surface of the flexible substrate;
    a driving element formed on one surface of the flexible substrate to control the light emitting layer; and
    a stretchable film provided on at least one of one surface and the other surface of the flexible substrate and divided into a low stretchable area covering at least a part of the driving element and a high stretchable area providing a stretchable property.

12. The stretchable display of claim 11, wherein the high stretchable area covers at least a part of the light emitting layer.

13. The stretchable display of claim 11, wherein the low stretchable area covers the light emitting layer and the driving element, and
    the high stretchable area covers a wiring connected to the driving element.

14. The stretchable display of claim 13, wherein the wiring is formed of an amorphous metal.

15. The stretchable display of claim 12, wherein the flexible substrate is formed of polyimide.

16. The stretchable display of claim 11, wherein a product of a modulus and a thickness of the high stretchable area of the stretchable film is greater than a product of a modulus and a thickness of the flexible substrate.

17. The stretchable display of claim 11, wherein a hole is formed in at least a partial area of the flexible substrate facing the high stretchable area.

18. The stretchable display of claim 11, wherein a groove providing a stretching path is formed on the other surface of the flexible substrate.

19. The stretchable display of claim 11, wherein the stretchable film is formed on an encapsulation layer that protects the light emitting layer.

* * * * *